United States Patent
Tai et al.

(10) Patent No.: US 10,303,536 B2
(45) Date of Patent: May 28, 2019

(54) NON-VOLATILE MEMORY DEVICE AND CONTROL METHOD THEREOF

(71) Applicant: VIA TECHNOLOGIES, INC., New Taipei (TW)

(72) Inventors: Ying Yu Tai, Mountain View, CA (US); Jiangli Zhu, San Jose, CA (US)

(73) Assignee: VIA TECHNOLOGIES, INC., New Taipei (TW)

( * ) Notice: Subject to any disclaimer, the term of this patent is extended or adjusted under 35 U.S.C. 154(b) by 400 days.

(21) Appl. No.: 15/265,909

(22) Filed: Sep. 15, 2016

(65) Prior Publication Data

US 2017/0123870 A1    May 4, 2017

Related U.S. Application Data

(60) Provisional application No. 62/247,199, filed on Oct. 28, 2015.

(51) Int. Cl.
| | |
|---|---|
| *G06F 11/00* | (2006.01) |
| *G06F 11/07* | (2006.01) |
| *G06F 3/06* | (2006.01) |
| *G11C 16/16* | (2006.01) |
| *G11C 16/34* | (2006.01) |
| *G11C 16/04* | (2006.01) |

(52) U.S. Cl.
CPC ............ *G06F 11/076* (2013.01); *G06F 3/064* (2013.01); *G06F 3/0619* (2013.01); *G06F 3/0679* (2013.01); *G06F 3/0688* (2013.01); *G06F 11/079* (2013.01); *G06F 11/0727* (2013.01); *G11C 16/16* (2013.01); *G11C 16/3431* (2013.01); *G11C 16/0483* (2013.01)

(58) Field of Classification Search
CPC .................. G06F 12/0246; G06F 12/02; G06F 2212/7201; G11C 11/1659; G11C 11/1673; G11C 11/1677; G11C 16/226; G11C 16/28; G11C 16/3495; G11C 29/34; G11C 29/52
See application file for complete search history.

(56) References Cited

U.S. PATENT DOCUMENTS

| | | | | |
|---|---|---|---|---|
| 5,488,702 | A * | 1/1996 | Byers ................... | G06F 11/1004 714/807 |
| 5,491,816 | A * | 2/1996 | Matoba ................. | G06F 11/004 714/2 |
| 6,628,545 | B1 * | 9/2003 | Li ....................... | G11C 16/3404 365/185.05 |

(Continued)

OTHER PUBLICATIONS

TW Office Action dated Jun. 29, 2017 in Taiwan application (No. 105130410).

*Primary Examiner* — Bryce P Bonzo
*Assistant Examiner* — Jeison C Arcos
(74) *Attorney, Agent, or Firm* — McClure, Qualey & Rodack, LLP

(57) ABSTRACT

A non-volatile memory device including a non-volatile memory and a controller is provided. The non-volatile memory includes a plurality of closed blocks and a plurality of open blocks. The controller derives a ratio value according to the write workload of the non-volatile memory between a first time point and a second time point and then performs a patrol read on a portion of the closed blocks according to the ratio value.

19 Claims, 4 Drawing Sheets

(56) References Cited

U.S. PATENT DOCUMENTS

| | | | | |
|---|---|---|---|---|
| 7,050,252 B1* | 5/2006 | Vallis | G11B 20/18 | 360/53 |
| 7,774,390 B2* | 8/2010 | Shin | G06F 12/0246 | 707/814 |
| 7,808,831 B2* | 10/2010 | Mokhlesi | G11C 11/5642 | 365/185.02 |
| 2008/0215954 A1* | 9/2008 | Oshikiri | G06F 11/1068 | 714/764 |
| 2009/0172499 A1* | 7/2009 | Olbrich | G06F 13/1657 | 714/773 |
| 2009/0251971 A1* | 10/2009 | Futatsuyama | G11C 16/344 | 365/185.22 |
| 2011/0185251 A1* | 7/2011 | d'Abreu | G06F 11/1072 | 714/752 |
| 2011/0199825 A1* | 8/2011 | Han | G11C 16/10 | 365/185.11 |
| 2012/0047317 A1* | 2/2012 | Yoon | G06F 3/0613 | 711/103 |
| 2012/0054582 A1* | 3/2012 | Byom | G06F 11/1072 | 714/773 |
| 2012/0069674 A1* | 3/2012 | Lee | G11C 16/3459 | 365/185.19 |
| 2012/0117445 A1* | 5/2012 | Lu | G06F 11/1666 | 714/763 |
| 2012/0127804 A1* | 5/2012 | Ong | G11C 7/1006 | 365/189.2 |
| 2013/0016558 A1* | 1/2013 | Ahn | G11C 16/0483 | 365/185.03 |
| 2013/0024641 A1* | 1/2013 | Talagala | G06F 11/3485 | 711/170 |
| 2013/0173970 A1* | 7/2013 | Kleveland | G11C 29/44 | 714/710 |
| 2013/0173972 A1* | 7/2013 | Kubo | G11C 16/00 | 714/718 |
| 2013/0212431 A1* | 8/2013 | Ong | G06F 15/167 | 714/15 |
| 2014/0040701 A1* | 2/2014 | Igari | G06F 11/1008 | 714/764 |
| 2014/0082411 A1* | 3/2014 | Warnes | G06F 11/1666 | 714/6.3 |
| 2014/0095775 A1* | 4/2014 | Talagala | G06F 12/0866 | 711/103 |
| 2014/0122774 A1* | 5/2014 | Xian | G06F 12/0246 | 711/103 |
| 2014/0136884 A1* | 5/2014 | Werner | G06F 11/2094 | 714/6.11 |
| 2014/0365836 A1* | 12/2014 | Jeon | G11C 16/26 | 714/721 |
| 2015/0178189 A1* | 6/2015 | Lasser | G06F 12/0246 | 714/6.11 |
| 2015/0220394 A1* | 8/2015 | Tanaka | G06F 11/1048 | 714/764 |
| 2015/0268871 A1* | 9/2015 | Shu | G06F 3/0616 | 711/103 |
| 2015/0331625 A1* | 11/2015 | Nishikubo | G06F 3/06 | 711/103 |
| 2015/0355845 A1* | 12/2015 | Lee | G06F 3/0679 | 711/103 |
| 2015/0370701 A1* | 12/2015 | Higgins | G06F 12/0253 | 711/103 |
| 2016/0104539 A1* | 4/2016 | Kim | G11C 16/28 | 365/185.12 |
| 2016/0124679 A1* | 5/2016 | Huang | G06F 3/0647 | 711/103 |
| 2016/0307635 A1* | 10/2016 | Kim | G11C 16/28 | |
| 2016/0343449 A1* | 11/2016 | Lee | G11C 11/5635 | |
| 2017/0069395 A1* | 3/2017 | Yao | G11C 16/3418 | |
| 2017/0090768 A1* | 3/2017 | Kakiki | G11C 29/44 | |

* cited by examiner

NON-VOLATILE MEMORY DEVICE AND CONTROL METHOD THEREOF

CROSS REFERENCE TO RELATED APPLICATIONS

This application claims the benefit of U.S. Provisional Application No. 62/247,199 filed Oct. 28, 2015, which application is hereby incorporated by reference in its entirety.

BACKGROUND OF THE INVENTION

Field of the Invention

The invention relates to a non-volatile memory device, and more particularly to a non-volatile memory device performing a patrol read on a portion of closed blocks.

Description of the Related Art

Memories mainly include volatile memories and non-volatile memories. The access speed of each volatile memory is fast. After the volatile memory is powered off, data stored in the volatile memory is lost. Conversely, after the non-volatile memory is powered off, the data stored in the non-volatile memory is maintained. However, the data stored in the non-volatile memory may be lost because the data may have been stored in non-volatile memory for too long and the charge stored in the non-volatile memory is lost. Therefore, the non-volatile memory may not be able to provide correct data.

BRIEF SUMMARY OF THE INVENTION

In accordance with an embodiment, a non-volatile memory device includes a non-volatile memory and a controller. The non-volatile memory includes a plurality of closed blocks and a plurality of open blocks. The controller derives a ratio value according to the write workload of the non-volatile memory between a first time point and a second time point and then performs a patrol read on a portion of the closed blocks according to the ratio value.

A control method for a non-volatile memory including a plurality of closed blocks and a plurality of open blocks is provided. An exemplary embodiment of a method for a portable device is described in the following. A ratio value is derived according to the write workload of the non-volatile memory between a first time point and a second point. A patrol read is performed on a portion of the closed blocks according to the ratio value.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
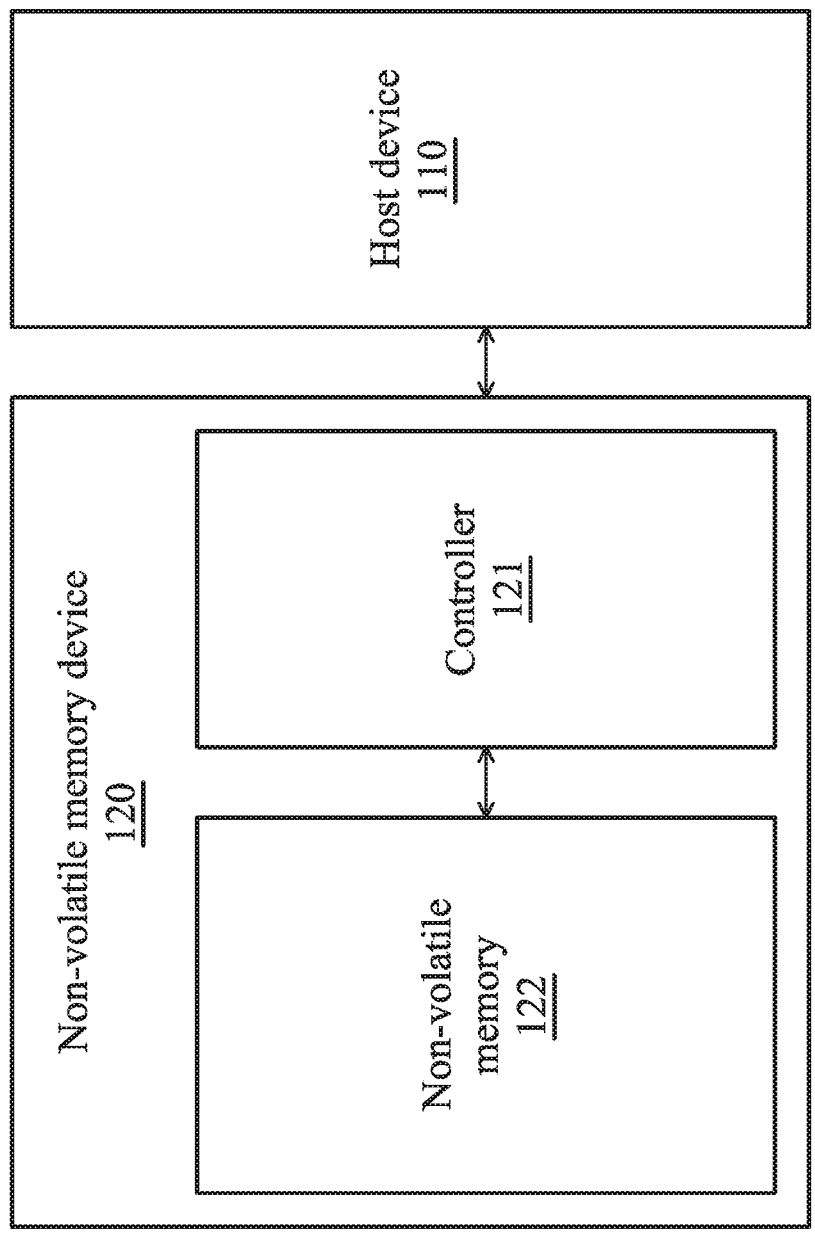
FIG. 1 is a schematic diagram of an exemplary embodiment of a control system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a control system, according to various aspects of the present disclosure. The control system 100 includes a host device 110 and a non-volatile memory device 120. The host device 110 writes data to the non-volatile memory device 120 or reads the data stored in the non-volatile memory device 120. The invention does not limit the kind of non-volatile memory device 120. In one embodiment, the non-volatile memory device 120 is an embedded MultiMedia Card (eMMC), but the disclosure is not so limited.

The non-volatile memory device 120 includes a controller 121 and a non-volatile memory 122. The controller 121 is configured to write data/the non-volatile memory 122 or read data stored in the non-volatile memory 122. The controller 121 may write data to the non-volatile memory 122 according to the write commands sent from the host device 110. In another embodiment, the controller 121 accesses the data stored in the non-volatile memory 122 according to program code stoned in the controller 121. For example, the controller 121 may perform a garbage collection operation according to the stored program code to abandon the invalid data stored in the non-volatile memory 122 and move the valid data stored in the non-volatile memory 122.

In one embodiment, the non-volatile memory 122 is a NAND flash, but the disclosure is not limited thereto. In other embodiments, the non-volatile memory 122 may be another type of memory. Generally, the non-volatile memory 122 has a plurality of blocks. The blocks are divided into a plurality of closed blocks and a plurality of open blocks. The controller 121 is not capable of writing data to the closed blocks. However, the controller 121 is capable of writing data to an open block until the open block is full.

When the data is stored in the non-volatile memory 122 for too long, the data stored in the non-volatile memory 122 may be lost, meaning that data retention problem is occurring in the non-volatile memory 122. Since the controller 121 may unsuccessfully read correct data from the non-volatile memory 122, when the non-volatile memory 122 is switched from a power-off status to a power-on status, the controller 121 executes a patrol read on all of the closed blocks to check bit error rate (BER) on all closed blocks.

When the BER of a closed block exceeds a tolerance value, the controller 121 performs a garbage collection operation for the closed block. In the garbage collection operation, the controller 121 moves the valid data stored in the closed block to at least one of the open blocks, discards the invalid data stored in the closed block, and erases the closed block. In another embodiment, when the BER of a closed block exceeds a tolerance value, the controller 121 executes a data move operation for the closed block. In the data move operation, the controller 121 moves all data including the valid data and the invalid data to at least one of the open blocks and then erases all data stored in the closed block.

After the controller 121 has performed the patrol read on all closed blocks, the controller 121 performs the patrol read again at regular time intervals (e.g. four hours) or in an idle mode to maintain the accuracy of data stored in the closed blocks. In this embodiment, before the controller 121 is ready to perform the patrol read again, the controller 121 derives a ratio value according to the write workload of the non-volatile memory 122 between a first time point and a second time point and then performs the patrol read on a portion of the closed blocks according to the ratio value.

The first time point is a time point when a previous patrol read has been performed on a portion of closed blocks. The second time point is a time point when the next patrol read is ready to be performed on a portion of closed blocks. In one embodiment, the controller 121 determines an original block which is filled first after the first time point and determines a final block which is filled last before the second time point. The controller 121 determines the write workload of the non-volatile memory 122 according to the property parameters of the original block and the final block. The controller 121 derives a ratio value according to the write workload of the non-volatile memory 122. The controller 121 performs the patrol read on a portion of the closed blocks according to the ratio value. In one embodiment, the controller 121 performs the patrol read on a portion of closed blocks from an oldest closed block according to the ratio value. In other embodiments, the controller 121 multiplies the ratio value by the number of closed blocks of the non-volatile memory to determine a ratio block value. In this embodiment, the ratio block value represents how many closed blocks the controller 121 performs the patrol read on. In one embodiment, from the oldest closed block, the controller 121 performs the patrol read on a portion of closed blocks. The number of closed blocks on which the patrol read is performed is equal to the ratio block value.

Compared to a conventional non-volatile memory, the conventional non-volatile memory determines the BER of each closed block before performing every patrol read. Therefore, the processing time of the conventional non-volatile memory is long, and the read bandwidth between a host device and the conventional non-volatile memory is occupied, and the power consumption of the conventional non-volatile memory is increased. However, in this embodiment, the controller 121 executes the patrol read on all closed blocks when the controller 121 executes the patrol read for the first time. In every following patrol read, the controller 121 executes the patrol read only for a portion of closed blocks. Therefore, the processing time of the non-volatile memory of the disclosure is short.

In one embodiment, the controller 121 reads the indexes or the time stamps of the original block and the final block to determine the write workload of the non-volatile memory 122. For example, the earlier the closed block is full, the smaller the index or the time stamp of the closed block is, however, without limitation to the present invention. In other embodiments, the earlier the closed block is full, the larger the index or the time stamp of the closed block is.

The invention does not limit how the controller 121 derives a ratio value p according to the write workload of the non-volatile memory 122. In one embodiment, the ratio value p is expressed by the following equation:

$$p = f(x, y);$$

wherein x indicates the property parameter of an original block which is full first after a previous patrol read, and y indicates the property parameter of a final block which is full last after the previous patrol read.

The controller 121 may utilizes any formulas to calculate the ratio value p according to the property parameters (e.g. indexes or time stamps) of the original block and the final block. The formulas utilized by the controller 121 are described in greater detail with reference to FIGS. 2A and 2B.

Figure 2A:
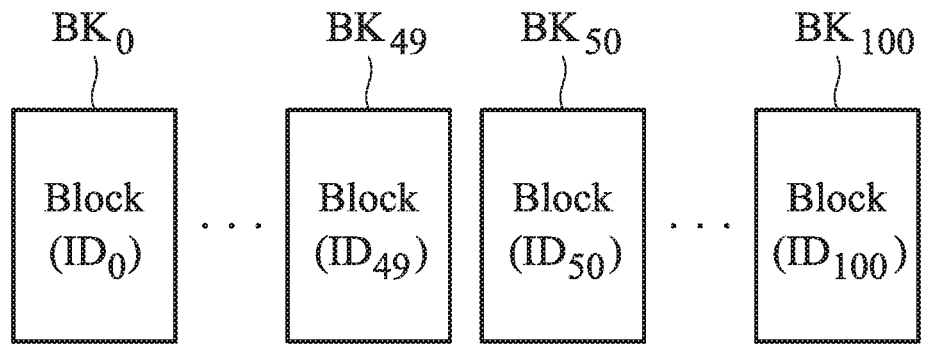
FIGS. 2A and 2B are schematic diagrams of exemplary embodiments of closed blocks, according to various aspects of the present disclosure.

FIG. 2A is a schematic diagram of an exemplary embodiment of closed blocks, according to various aspects of the present disclosure. Assume that when the non-volatile memory 122 is switched to a power-off status, the blocks $BK_0 \sim BK_{49}$ have been filled. In this case, when the non-volatile memory 122 is switched from the power-off status to a power-on status, the controller 121 performs a patrol read on the blocks $BK_0 \sim BK_{49}$ and sets the indexes of the blocks $BK_0 \sim BK_{49}$ to $ID_0 \sim ID_{49}$.

Next, the controller 121 accesses the non-volatile memory 122. When the controller 121 stores data in a block and the block is filled, the controller 121 sets the index of the block. Assume that when the controller 121 is ready to perform the patrol read again, the blocks $BK_0 \sim BK_{100}$ have been filled and the blocks $BK_0 \sim BK_{100}$ respectively have indexes $ID_0 \sim ID_{100}$. The controller 121 obtains a ratio value p according to the index (e.g. $ID_{50}$) of the closed block (e.g. $BK_{50}$) which is full first after a previous patrol read and the index (e.g. $ID_{100}$) of the closed block (e.g. $BK_{100}$) which is full last after the previous patrol read. In this embodiment, the ratio value p is expressed by the following equation (1):

$$p = 1 - \left(\frac{y-x}{y}\right). \qquad \text{Equation (1)}$$

wherein p is a ratio value, x is an index (e.g. $ID_{50}$) of the closed block (e.g. $BK_{50}$) which is filled first after the previous patrol read, and y is an index (e.g. $ID_{100}$) of the closed block (e.g. $BK_{100}$) which is filled last after the previous patrol read.

If we substitute x=50 and y=100 in equation (1), the substituted result is p=1/2. Therefore, the controller 121 performs the patrol read on half of the closed blocks according to the ratio value (1/2). In one embodiment, the controller 121 does not perform the patrol read on the closed blocks ($BK_{50} \sim BK_{100}$) which are filled after the previous patrol read. In another embodiment, the controller 121 performs the patrol read on a portion of closed blocks from the oldest closed block (e.g. $BK_0$) according to the ratio value (1/2). In other embodiments, after obtaining the ratio value p, the controller 121 multiplies the ratio value (1/2) by the number (101) of all the closed blocks to determine how many closed blocks the patrol read is performed on. In this case, the controller 121 performs the patrol read on 50 closed blocks. In one embodiment, from the oldest closed block (e.g. $BK_0$), the controller 121 performs the patrol read on the following 49 closed blocks, such as the closed blocks $BK_1 \sim BK_{49}$.

Since the controller 121 does not perform the patrol read on all closed blocks, the processing time of the non-volatile memory device 120 can be reduced effectively, the read bandwidth between the host device 110 and the controller 121 does not have to be occupied, and the power consumption of the non-volatile memory device 120 is decreased.

In another embodiment, the controller 121 determines how many closed blocks the patrol read is performed on according to the following equation (2).

$$p = 1 - \left(\frac{y-x}{y}\right)K. \qquad \text{Equation (2)}$$

wherein p indicates the ratio value, x indicates an index (e.g. $ID_{50}$) of the closed block which is filled first after the previous patrol read, y indicates an index (e.g. $ID_{100}$) of the closed block which is filled last after the previous patrol read, and K is a fixed parameter defined by an IC designer. In one embodiment, 0<K<1.

Assume that K=05. If x=50 and y=100 are substituted in equation (2), the ratio value p is equal to 3/4. In one embodiment, the controller 121 multiplies the ratio value (3/4) by the number (101) of all closed blocks to determine a ratio block value. The ratio block value is approximately 75. The ratio block value means how many closed blocks the patrol read is performed on. In one embodiment, the controller 121 performs the patrol read from the oldest closed block (e.g. $BK_0$) on the following 74 closed blocks.

In other embodiments, the controller 121 executes the patrol read for a portion of closed blocks according to the following equation (3).

$$p = 1 - \left(\frac{x}{y}\right)^M. \qquad \text{Equation (3)}$$

wherein p indicates a ratio value, x indicates an index (e.g. $ID_{50}$) of the closed block which is full first after a previous patrol read, y indicates an index (e.g. $ID_{100}$) of the closed block which is full last after the previous patrol read, and M is a fixed parameter defined by an IC designer. In one embodiment, M is an integer, such as 1, 2, 3 . . . .

Assume that we substitute M=2, x=50, and y=100 in equation (3), the controller 121 determines that the ratio value p is 3/4. In one embodiment, the controller 121 multiplies the ratio value p (3/4) by the number (101) of closed blocks to determine a ratio block value. The ratio block value is approximately 75 and represents the number of required closed blocks on which the patrol read is performed. In one embodiment, from an oldest closed block (e.g. $BK_0$), the controller 121 performs the patrol read on the following 74 closed blocks.

Figure 2B:
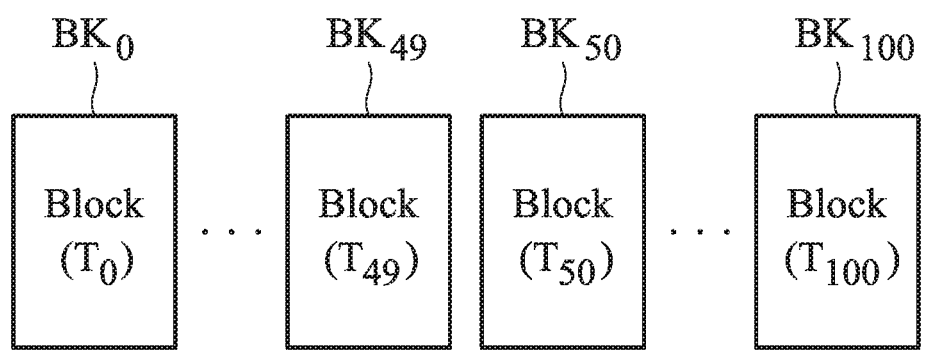

FIG. 2B is a schematic diagram of another exemplary embodiment of the closed blocks, according to various aspects of the present disclosure. In this embodiment, the closed blocks $BK_0 \sim BK_{100}$ have time stamps $T_0 \sim T_{100}$ respectively. The time stamp references the time point when the corresponding block is filled. For example, the block $BK_0$ is filled at the time point $T_0$, and the block $BK_{100}$ is filled at the time point $T_{100}$. In one embodiment, the controller 121 determines a ratio block value p' according to the following equation (4).

$$p' = \left(\frac{N}{\Delta t}\right) \times t_x. \qquad \text{Equation (4)}$$

wherein p' indicates the number of required closed blocks on which the patrol read is performed, x indicates a time stamp (e.g. $T_{50}$) of the closed block which is filled first after a previous patrol read, $\Delta t$ is a time difference (e.g. 1 sec) between a time stamp (e.g. $T_{100}$) of the closed block which is filled last after the previous patrol read and the time stamp (e.g. $T_{50}$) of the closed block which is filled first after the previous patrol read, N is the number (e.g. 50) of closed blocks which are filled by the controller 121 during the time points $T_{50} \sim T_{100}$.

After determining the ratio block value p', the controller 121 performs the patrol read on a portion of closed blocks from the oldest closed block, wherein the number of closed blocks which the patrol read is performed on is equal to the ratio block value p'. Since the controller 121 does not perform the patrol read on all closed blocks, the processing time of the controller 121 can be reduced.

In the embodiment above, the controller 121 performs the patrol read from the oldest closed block, but the disclosure is not limited thereto. In one embodiment, the controller 121 obtains an oldest closed block according to at least one of the BER, a program/erase (P/E) cycle count, a fail bit count (FBC), and the retention time of each of the closed blocks $BK_0 \sim BK_{100}$. Then, the controller 121 performs the patrol read on a portion of closed blocks from the oldest closed block.

For example, if the BER of a specific block (e.g. $BK_{30}$) among the closed blocks $BK_0 \sim BK_{100}$ is highest in the BERs of the closed blocks $BK_0 \sim BK_{100}$, it means that the charge loss may have occurred in the specific block, and the specific block is an oldest block. Therefore, from the closed block $BK_{30}$, the controller 121 performs the patrol read on the following closed blocks (e.g. $BK_{31} \sim BK_{79}$). If the P/E cycle count of a specific block (e.g. $BK_0$) among the closed blocks $BK_0 \sim BK_{100}$ is highest in the P/E cycle counts of the closed blocks $BK_0 \sim BK_{100}$, it means that the specific block is an oldest block. Therefore, from the closed block $BK_0$, the controller 121 performs the patrol read on a portion of closed blocks (e.g. $BK_1 \sim BK_{49}$). When the FBC of a specific block (e.g. $BK_0$) among the closed blocks $BK_0 \sim BK_{100}$ is highest in the closed blocks $BK_0 \sim BK_{100}$, it means that the specific block is an oldest block. Therefore, from the closed block $BK_0$, the controller 121 performs the patrol read on a portion of the closed blocks (e.g. $BK_1 \sim BK_{49}$). When the retention time of a specific block (e.g. $BK_0$) among the closed blocks $BK_0 \sim BK_{100}$ is longest in the closed blocks $BK_0 \sim BK_{100}$, it means that the data has been stored in specific block for too long, and that the specific block is an oldest block. Therefore, from the closed block $BK_0$, the controller 121 performs the patrol read on a portion of closed blocks (e.g. $BK_1 \sim BK_{49}$).

Figure 3:
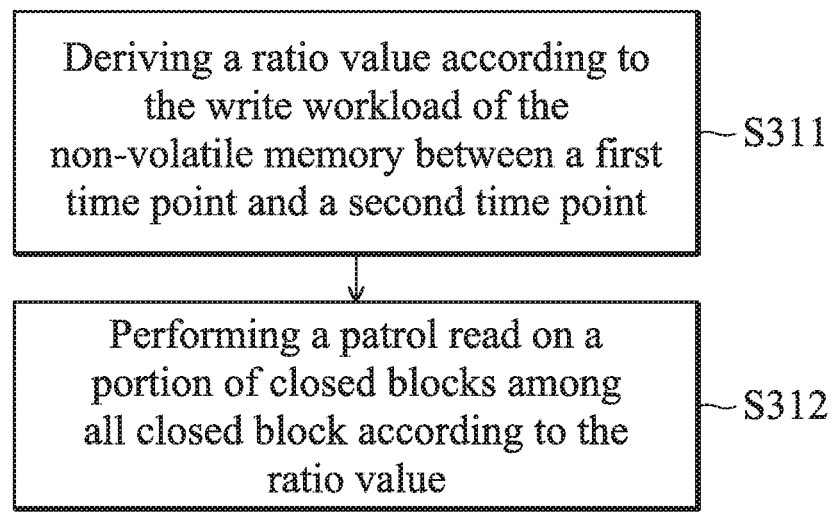
FIG. 3 is a flowchart of an exemplary embodiment of a control method, according to various aspects of the present disclosure.

FIG. 3 a flowchart of an exemplary embodiment of a control method, according to various aspects of the present disclosure. The control method is applied to anon-volatile memory. The non-volatile memory includes a plurality of closed blocks and a plurality of open blocks. First, a ratio value is derived according to the write workload of the non-volatile memory between a first time point and a second time point (step S311). In this embodiment, the first time point is the time point when a previous patrol read has been performed, and the second time point is the time point when the next patrol read is ready to be performed.

In one embodiment, step S311 is to determine the number of closed blocks which are filled between the first and second time points and derive a ratio value according to the number of closed blocks which are filled between the first and the second time points. In another embodiment, step S311 is to determine an original block which is filled first after the first time point, and determine a final block which is filled last before the second time point, and derive the ratio value according to property parameters of the original block and the final block. The property parameters include indexes shown in FIG. 2A or time stamps shown in FIG. 2B of the original block and the final block. In other embodiments, step S311 is to multiply the ratio value by the number of all of the closed blocks to determine how many closed blocks the patrol read is performed on. In some embodiments, step S311 obtains the ratio value according to one of the equations (1)~(4).

Then, a patrol read is performed on a portion of closed blocks among all closed blocks according to the ratio value (step S312). Assume that the ratio value p is obtained and equal to 1/2 after step S311. In this case, step S312 is to perform the patrol read on half of all closed blocks. In this embodiment, the patrol read is to check the BER of the corresponding closed block. If the BER of a closed block exceeds a tolerance value, garbage collection is performed on the closed block. In other words, the valid data of the closed block is moved to at least one of the open blocks and the closed block is erased. In another embodiment, when the BER of a closed block exceeds a tolerance value, the data stored in the closed block is moved. In this case, the valid data and invalid data of the closed block are moved to at least one of the open blocks and the closed block is erased.

The invention does not limit which block step S312 performs the patrol read from. In one embodiment, step S312 performs the patrol read on a portion of closed blocks from the present oldest closed block. Taking FIG. 2A as an example, assume that the block $BK_0$ is the oldest closed block. If the ratio value is 1/4, step S312 performs the patrol read on the blocks $BK_0$~$BK_{24}$. In other embodiments, step S312 determines the oldest block according to at least one of the BER, the P/E cycle count, the FBC, and the retention time of each closed block, and performs the patrol read from the oldest block according to the ratio value.

In other embodiments, the controller 121 multiplies the ratio value by the number of all closed blocks of the non-volatile memory 122 to determine a ratio block value. From the oldest closed block, the controller 121 performs the patrol read on a portion of closed blocks, wherein the number of closed blocks on which the patrol read is performed is equal to the ratio block value.

Figure 4:
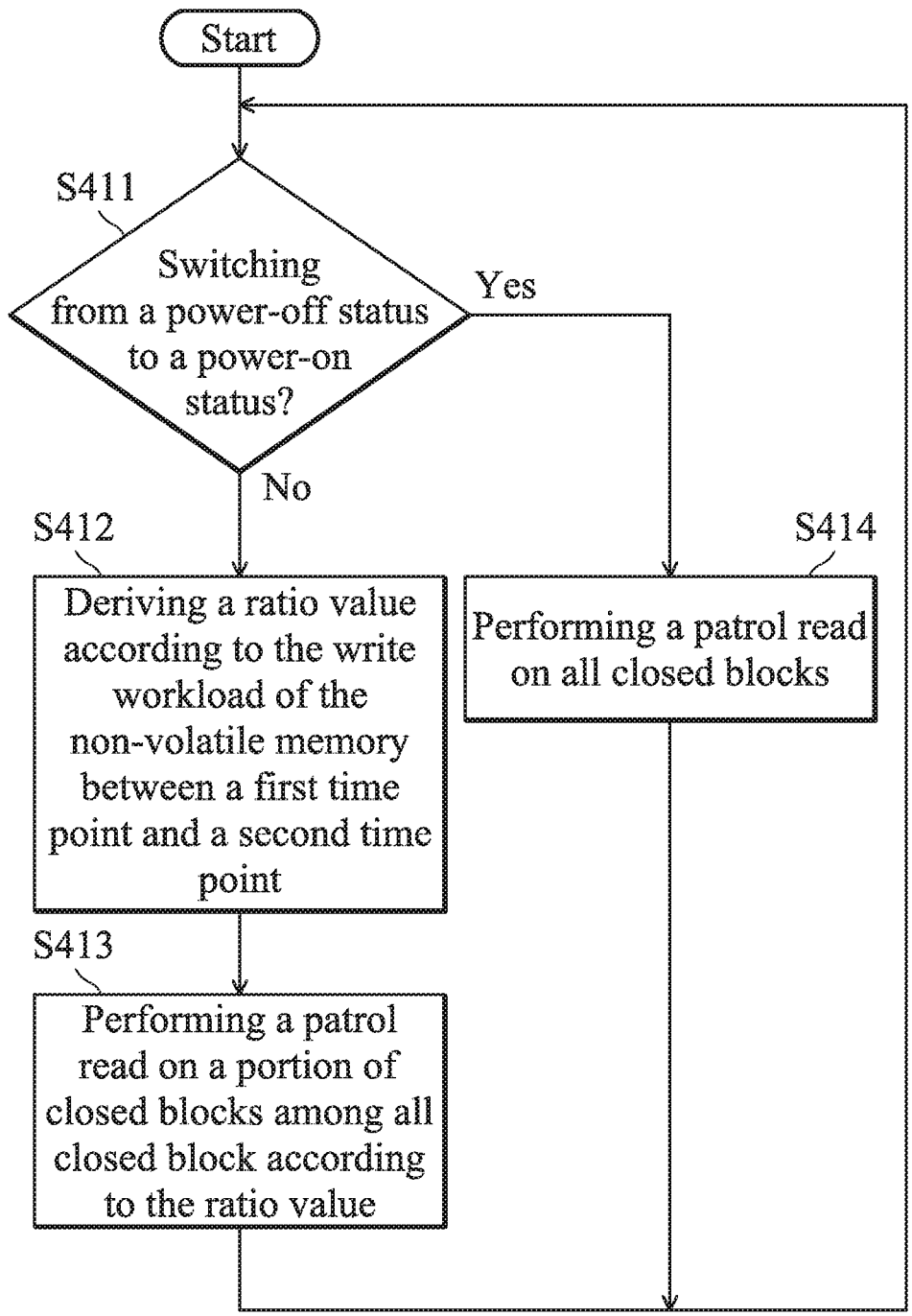
FIG. 4 is a flowchart of another exemplary embodiment of the control method, according to various aspects of the present disclosure.

FIG. 4 a flowchart of another exemplary embodiment of the control method, according to various aspects of the present disclosure. First, it is determined whether the non-volatile memory is switched from a power-off status to a power-on status (step S411). When the non-volatile memory is switched from the power-off status to the power-on status, the patrol read is performed on all closed blocks (step S414). Then, step S411 is executed.

When the non-volatile memory is not switched from the power-off status to the power-on status, a ratio value is derived according to the write workload of the non-volatile memory between a first time point and a second point (step S412) and a patrol read is performed on a portion of closed blocks according to the ratio value (step S413). Since step S412 and S311 have the same principle and step S413 and S312 have the same principle, descriptions of steps S412 and S413 are omitted for brevity.

Since step S413 performs the patrol read only on a portion of closed blocks, the processing time and the power consumption of the non-volatile memory can be reduced. In addition, the patrol read moves the data stored in non-volatile memory for too long to maintain the accuracy of data stored in non-volatile memory.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant an and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory device, comprising:
    a non-volatile memory comprising a plurality of closed blocks and a plurality of open blocks; and
    a controller configured to perform a patrol read on all of the closed blocks when the non-volatile memory is switched from a power-off status to a power-on status, and further configured to derive a ratio value according to a write workload of the non-volatile memory between a first time point and a second time point and perform a subsequent patrol read on only a portion of the closed blocks according to the ratio value.

2. The non-volatile memory device as claimed in claim 1, wherein the patrol read is to determine a bit error rate (BER) for each of the portion of the closed blocks, and when BER of a first closed block among the portion of the closed blocks exceeds a tolerance value, the controller moves valid data of the first closed block to at least one of the open blocks and erases the first closed block.

3. The non-volatile memory device as claimed in claim 2, wherein when the BER of the first closed block exceeds the tolerance value, the controller moves the valid data and invalid data of the first closed block to at least one of the open blocks and erases the first closed block.

4. The non-volatile memory device as claimed in claim 1, wherein the write workload is a number of blocks which are filled when the non-volatile memory operates between the first and second time points.

5. The non-volatile memory device as claimed in claim 1, wherein the first time point is a time point when a previous patrol read has been performed, and the second time point is a time point when a next patrol read is ready to be performed.

6. The non-volatile memory device as claimed in claim 1, wherein the controller determines an original block which is filled first after the first time point and determines a final block which is filled last before the second time point,
    wherein the controller derives the ratio value according to property parameters of the original block and the final block, and determines the number of portion of the closed blocks on which the patrol read is performed according to the ratio value.

7. The non-volatile memory device as claimed in claim 6, wherein the property parameters include indexes or time stamps of the original block and the final block.

8. The non-volatile memory device as claimed in claim 1, wherein the controller determines the number of portion of the closed blocks by multiplying the ratio value by the number of all of the closed blocks.

9. The non-volatile memory device as claimed in claim 1, wherein the controller determines an oldest closed block according to a BER, a program/erase (P/E) cycle count, a fail bit count (FBC), or a retention time of each of the closed blocks, and performs the patrol read on the portion of the closed blocks from the oldest closed block.

10. A control method applied to a non-volatile memory device having a controller and non-volatile memory with a plurality of closed blocks and a plurality of open blocks, the control method comprising:
    deriving, with the controller, a ratio value according to a write workload of the non-volatile memory between a first time point and a second point;
    performing, with the controller, a patrol read on all of the closed blocks when the non-volatile memory is switched from a power-off status to a power-on status; and
    performing, with the controller, a subsequent patrol read on only a portion of the closed blocks according to the ratio value.

11. The control method as claimed in claim 10, wherein the step of performing the patrol read on the portion of the closed blocks according to the ratio value comprises:
    determining a bit error rate (BER) of each of the portion of the closed blocks, wherein when the BER of a first closed block among the portion of the closed blocks exceeds a tolerance value, valid data of the first closed block is moved to at least one of the open blocks and the first closed block is erased.

12. The control method as claimed in claim 11, wherein when the BER of the first closed block exceeds the tolerance value, the valid data and invalid data of the first closed block are moved to at least one of the open blocks and the first closed block is erased.

13. The control method as claimed in claim 10, wherein the write workload is the number of blocks which are filled when the non-volatile memory operates between the first and second time points.

14. The control method as claimed in claim 10, wherein the first time point is a time point when a previous patrol read has been performed, and the second time point is a time point when a next patrol read is ready to be performed.

15. The control method as claimed in claim 10, wherein the step of deriving the ratio value according to the write workload of the non-volatile memory between the first time point and the second point comprises:
    determining an original block which is filled first after the first time point;
    determining a final block which is filled last before the second time point;
    deriving the ratio value according to property parameters of the original block and the final block; and
    determining the number of portion of the closed blocks on which the patrol read is performed according to the ratio value.

16. The control method as claimed in claim 15, wherein the property parameters include indexes or time stamps of the original block and the final block.

17. The control method as claimed in claim 10, further comprising:
    multiplying the ratio value by the number of all of the closed blocks to determine the number of portion of the closed blocks.

18. The control method as claimed in claim 10, further comprising:
    determining an oldest closed block according to a BER, a program/erase (P/E) cycle count, a fail bit count (FBC), or a retention time of each of the closed blocks; and
    performing the patrol read on the portion of the closed blocks from the oldest closed block.

19. The non-volatile memory device as claimed in claim 1, wherein the controller is further configured to multiply the ratio value by the number of all of the closed blocks to determine a ratio block value and then perform the subsequent patrol read on the portion of the closed blocks according to the ratio block value, and wherein the number of required closed blocks on which the subsequent patrol read is performed is equal to the ratio block value.

* * * * *